United States Patent

[11] 3,576,515

[72] Inventor Robert Houston Frantz
Mount Holly Spring, Pa.
[21] Appl. No. 755,704
[22] Filed Aug. 27, 1968
[45] Patented Apr. 27, 1971
[73] Assignee AMP Incorporated
Harrisburgh, Pa.

[54] PRINTED CIRCUIT EDGE CONNECTOR
6 Claims, 2 Drawing Figs.

[52] U.S. Cl. .......... 339/74, 317/101, 339/176
[51] Int. Cl. .......... H01r 13/62
[50] Field of Search .......... 339/17, 74, 75, 176; 317/101 (DH)

[56] References Cited

UNITED STATES PATENTS

| | | | |
|---|---|---|---|
| 2,730,683 | 1/1956 | Ayres et al. | 339/17 |
| 2,731,609 | 1/1956 | Sobel | 339/17 |
| 3,426,313 | 2/1969 | Wycheck | 339/74 |
| 3,430,186 | 2/1969 | Herb et al. | 339/74 |

*Primary Examiner*—Marvin A. Champion
*Assistant Examiner*—Joseph H. McGlynn
*Attorneys*—Curtis, Morris and Safford, Marshall M. Holcombe, William Hintze, William J. Keating, Frederick W. Raring, John R. Hopkins, Adrian J. LaRue and Jay L. Seitchik

ABSTRACT: The disclosure relates to a printed circuit edge connector which is capable of connecting a plurality of printed circuit boards with connector elements extending outwardly from the edges thereof to a connector housing wherein the terminals are positioned on at least two adjacent sides of the printed circuit board and without this assembling of the connector housing. This is accomplished by use of a pin which is inserted into a slot in the connector housing in which the connector elements are positioned and pushes all of the connector elements therein in a direction out of the slot through which the terminals on the printed circuit board would travel during assembly. In this way, the printed circuit board can be slid along the grooves of the connector housing for the full length thereof while the pin is inserted and is biasing the connectors in the connector housing out of the path of travel. Upon removal of the pin, the connectors in the connector housing assume their original position due to their resiliency or spring action and abut the terminals of the printed circuit to complete the electrical connection.

Figure 1:
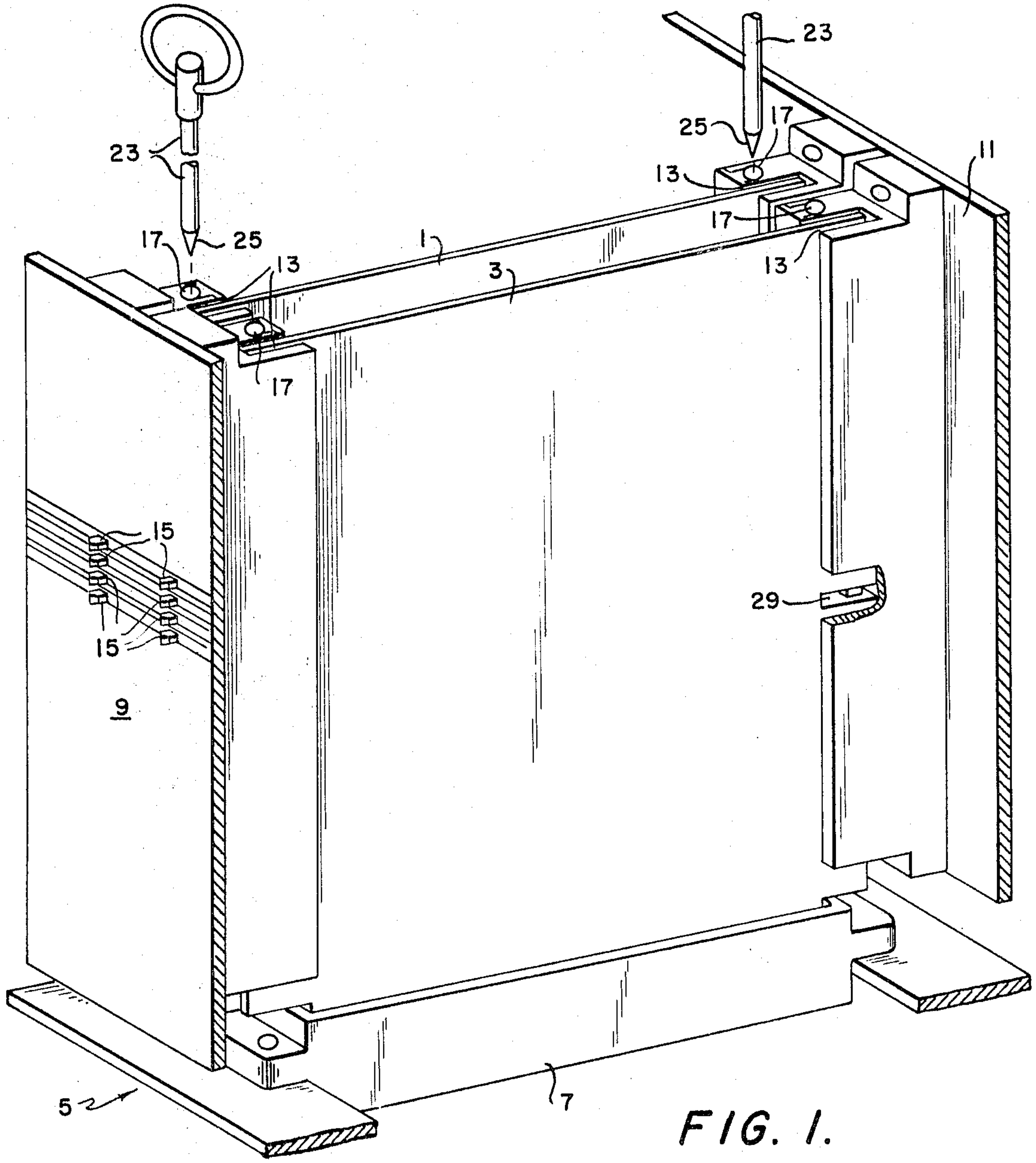

INVENTOR
ROBERT H. FRANTZ

BY [signature]

ATTORNEY

PRINTED CIRCUIT EDGE CONNECTOR

This invention relates to printed circuit edge connectors and, more specifically, to a means and method of interconnecting one or a plurality of circuit boards wherein the circuit boards have terminals extending outwardly from the edges thereof and on at least two adjacent sides thereof whereby the connector housing does not have to be disassembled in order to make the electrical connection between the connector housing and the printed circuit boards.

A standard problem which arises in the electrical component industry is that of interconnecting one or a plurality of printed circuit boards having electrical circuits thereon to each other within a single housing or to circuits external to the housing. This problem becomes specifically acute in those instances where the printed circuit board has outwardly extending circuit paths, these paths extending outwardly from at least two adjacent ones of the four edges of the printed circuit board. In such instances, it has been relatively impossible, in accordance with the prior art, to make interconnection between connector housings and printed circuit boards of this type without first disassembling the connector housing and then assembling the parts of the connector housing individually onto the printed circuit board paths in order to make the connection or without damaging the paths on the printed circuit board. It can be seen that these procedures are costly because the time required for assembly and disassembly is great relative to the situation where the connector board can merely be plugged directly into the connector housing. Furthermore, damaging of printed circuit board paths can render a completed board useless.

The above problems are overcome in accordance with the present invention wherein there is provided a connector housing having a plurality of slots, the slots being designed to receive printed circuit boards endwise therein, the housing also including resilient connectors biased to be positioned within the slot whereby electrical connection can be made to the terminals of the printed circuit board by the contacting of the connectors with the circuits paths of the printed board. The printed circuit board is positioned within the housing by moving the connectors in the housing from the slots through which the printed circuit is to pass during assembly. This is accomplished by providing a connector having a bend which passes into an aperture extending lengthwise of the housing and parallel with the slots. In accordance with the present invention, a pin is inserted throughout the full length of the aperture whereby it abuts and biases the connectors so that they are moved outside of the slots and leave a clear slot for insertion of the printed circuit board. After the printed circuit board has been inserted without impediment due to the removal of the connector elements from the slots, the pins are then removed and the connector elements, due to their resiliency and their spring bias inwardly toward the slots, return to their initial position and make an abutting connection with the circuit paths of the printed circuit board. The printed circuit boards are then completely connected within the housing in final operating state.

It is therefore an object of the present invention to provide an electrical connector housing wherein a single mechanical operation from outside the connector housing will remove the connector elements therein from the printed circuit card entry slot during entry of a printed circuit board.

It is a further object of this invention to provide a means and method for quickly and economically interconnecting and/or disconnecting a connector housing and a printed circuit board having circuit paths on at least two adjacent sides thereof without disassembling the connector housing.

It is a still further object of this invention to provide an electrical connector assembly capable of receiving printed circuit boards with circuit paths without damaging the terminals.

Figure 2:
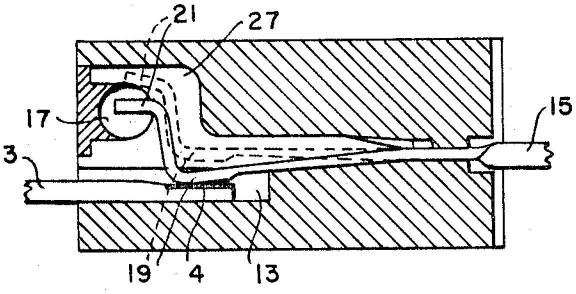

The above objects and still further objects of this invention will become readily apparent to those skilled in the art after consideration of the following specific preferred embodiment thereof which is provided by way of example and not by way of limitation, wherein:

FIG. 1 is a pictorial view, partially cut away, showing the edge connector and printed circuit boards in the finally connected state; and FIG. 2 is a sectional view showing the position of the connector elements of the connector housing with the printed circuit boards in place and showing the connector elements in phantom when the pin is positioned within the aperture to provide bias thereto.

Referring now to the drawings, there are shown a pair of printed circuit boards 1 and 3, the printed circuit boards having outwardly extending circuit paths 4 positioned on the outside edges thereof and on at least two of the adjacent edges thereof. It is necessary that these printed circuit boards be inserted into the connector housing 3 having a bottom connector block member 7 and side connector block members 9 and 11. The block members 7, 9 and 11 each include rows of resilient connector members of the type shown in FIG. 2 and labeled 15 except for the bottom member 7 which can have any type of connector capable of receiving the printed circuit board.

Each of the elements 9 and 11 includes a plurality of slots 13 (better shown in FIG. 2), there being two such slots for receiving new printed circuit board. Positioned on the elements 9 and 11, in rows and columns, are the electrical connectors 15 which extend therethrough to the outer side of the connector housing 5 as shown in FIGS. 1 and 2.

The inner portion of the block elements 9 and 11 includes an aperture 17 which extends lengthwise for the entire length of the blocks 9 and 11, the connector elements 15 having a pair of right-angle bends whereby a portion 19 thereof normally is biased to extend into the slot 13 and another portion 21 thereof extends into the aperture 17 via grooves 27 which are formed within the block elements 9 and 11.

In order to insert the printed circuit boards 1 and 3 into the connector housing 5, a pair of pins 23 are passed through the apertures 17 for the entire length thereof. The pins 23 include a cone-shaped tip 25 and, during movement through the aperture 17, abut the portion 21 of the connectors 15 and force or bias same away from the slot and farther into the groove 27 (better shown in phantom in FIG. 2). As shown in phantom, the connector 15 and, especially the portion 19 thereof is biased out of the slot 13 by the insertion of the pin 23.

With the slots 13 cleared of any printed circuit board impeding elements, the boards with the circuit paths 4 thereon can be inserted through the slots 13 and make connection with the connectors in the block member 7 of the connector block 5. At this point, the inserted pins 23 are removed from the aperture 17 and the connector elements 15, and especially, the portions 19 thereof are biased back to their original positions whereby the portions 19 will enter the slot 13 as shown in FIG. 2. However, since the printed circuit boards 1 and 3 are now positioned in the slots 13, the portions 19 of the connectors 15 will merely abut the circuit paths on the printed circuit boards and make an electrical connection therewith. The printed circuit boards are removed in the same manner by inserting the pins 23 and then removing the boards.

It can be seen that the method of insertion of printed circuit boards and the connector housing therefor provide for simple, economic and rapid connection and disconnection of printed circuit boards of the types specified herein.

In the event keying is desired whereby only predetermined printed circuit boards can be used, the boards can have the circuit paths 4 replaced by slots in which electrically conductive material is placed. The slots in the boards are shaped to conform to the shape of the portion 19 of the connector 15 whereby contact is made only if the proper board is inserted into the slots 13. A slot 29 of this type is shown in the printed circuit board 3 in FIG. 1 in the cutout portion of the block member 11.

Though the invention has been described with respect to a specific preferred embodiment thereof, many variations and modifications thereof will immediately become apparent to those skilled in the art. It is therefore the intention that the appended claims be interpreted as broadly as possible in view of the prior art to include all such variations and modifications.

I claim:

1. An electrical connector block which comprises a pair of spaced end members, each said end member defining a slot, said slots being coplanar and opening into a space defined between said end members, a plurality of contact members disposed in at least one of said end members and normally extending into the slot thereof and means positionable axial of said members and adjacent said slot for removing all of said contact members from said slot.

2. An electrical connector block as set forth in claim 1, wherein each said end member further includes an aperture extending therethrough for receiving said means for removing all of said contact members from said slot, and having an axis substantially parallel to the slot therein and groove means extending between said aperture and said slot whereby the insertion of said means for removing into said aperture removes all of said contact members out of said slot.

3. An electrical connector block as set forth in claim 2, wherein said means for removing is a relatively hard cylindrical member having a beveled end.

4. An electrical connector block as set forth in claim 1, wherein said means for removing all of said contact members from said slot is a means for biasing said contact members out of said slot.

5. An electrical connector block as set forth in claim 4, wherein each said end member further includes an aperture extending therethrough for receiving said means for removing all of said contact members from said slot, and having an axis substantially parallel to the slot therein and groove means extending between said aperture and said slot whereby the insertion of said means for removing into said aperture removes all of said contact members out of said slot.

6. An electrical connector block as set forth in claim 5, wherein said means for removing is a relatively hard cylindrical member having a beveled end.